US007551019B2

(12) United States Patent
Fujita et al.

(10) Patent No.: US 7,551,019 B2
(45) **Date of Patent: *Jun. 23, 2009**

(54) SEMICONDUCTOR INTEGRATED CIRCUIT AND SOURCE VOLTAGE/SUBSTRATE BIAS CONTROL CIRCUIT

(75) Inventors: Tetsuya Fujita, Kanagawa (JP); Mototsugu Hamada, Palo Alto, CA (US); Hiroyuki Hara, Kanawaga (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/764,605

(22) Filed: Jun. 18, 2007

(65) Prior Publication Data

US 2007/0236276 A1 Oct. 11, 2007

Related U.S. Application Data

(62) Division of application No. 10/899,004, filed on Jul. 27, 2004, now Pat. No. 7,245,177.

(30) Foreign Application Priority Data

Oct. 31, 2003 (JP) ............................ 2003-372615

(51) Int. Cl.
*G05F 3/16* (2006.01)
*H03L 1/00* (2006.01)

(52) U.S. Cl. ...................................... 327/537; 327/535

(58) Field of Classification Search ....................... None
See application file for complete search history.

(56) References Cited

U.S. PATENT DOCUMENTS

| | | | | |
|---|---|---|---|---|
| 5,397,934 | A | 3/1995 | Merrill et al. | 327/537 |
| 5,834,966 | A | 11/1998 | So et al. | 327/534 |
| 5,883,544 | A | 3/1999 | So et al. | 327/537 |
| 5,929,695 | A | 7/1999 | Chan et al. | 327/537 |

(Continued)

FOREIGN PATENT DOCUMENTS

| | | |
|---|---|---|
| JP | 2000-286387 | 10/2000 |
| JP | 2002-111470 | 4/2002 |

OTHER PUBLICATIONS

T. Kuroda, et al. "IEEE Journal of Solid-State Circuits, vol. 31, No. 11, pp. 1770-1779, A 0.9-V, 150-MHZ, 10-MV, 4MM$^2$, 2-D Discrete Cosine Transform Core Processor With Variable Threshold-Voltage (VT) Scheme", Nov. 1996.

(Continued)

*Primary Examiner*—Lincoln Donovan
*Assistant Examiner*—Terry L Englund
(74) *Attorney, Agent, or Firm*—Oblon, Spivak, McClelland, Maier & Neustadt, P.C.

(57) ABSTRACT

This disclosure concerns a semiconductor integrated circuit that includes a semiconductor substrate, a plurality of well regions formed on one surface of the semiconductor substrate and electrically isolated from each other, a plurality of MOS transistors formed in the well regions and a substrate bias generator that applies substrate biases to the individual well regions based on actually measured process-derived variance of the MOS transistors in threshold voltage to bring the threshold voltages of the respective MOS transistors into conformity with a normal threshold voltage.

9 Claims, 14 Drawing Sheets

U.S. PATENT DOCUMENTS

| | | | | |
|---|---|---|---|---|
| 6,429,726 | B1 | 8/2002 | Bruneau et al. | 327/537 |
| 6,621,325 | B2 * | 9/2003 | Hart et al. | 327/534 |
| 6,943,613 | B2 * | 9/2005 | Miyazaki et al. | 327/534 |
| 7,060,566 | B2 * | 6/2006 | Vogelsang | 438/270 |
| 2005/0116765 | A1 | 6/2005 | Sakiyama et al. | 327/534 |

OTHER PUBLICATIONS

M. Mizuno, et al. IEEE International Solid-State Circuits Conference, Digest of Technical Papers, Session 18, Paper SA 18.2, pp. 300-301, "Elastic-VT CMOS Circuits for Multiple On-Chip Power Control", 1996.

J. Tschantz, et al. IEEE International Solid-State Circuits Conference, Digest of Technical Papers, Session 25, Paper SA 25.7, pp. 422-423, "Adaptive Body Bias For Reducing Impacts of Die-To-Die and Within-Die Parameter Variations on Microprocessor Frequency and Leakage", 2002.

* cited by examiner

SEMICONDUCTOR INTEGRATED CIRCUIT AND SOURCE VOLTAGE/SUBSTRATE BIAS CONTROL CIRCUIT

CROSS-REFERENCE TO RELATED APPLICATIONS

This application is a divisional Application of, and claims the benefit of priority under 35 U.S.C. § 120 from, U.S. application Ser. No. 10/899,004, now U.S. Pat. No. 7,245,177, filed Jul. 27, 2004, which claims the benefit of priority under 35 U.S.C. § 119 from Japanese Patent Application No. 2003-372615, filed on Oct. 31, 2003. The entire contents of each of the above applications are incorporated herein by reference.

BACKGROUND OF THE INVENTION

1. Field of the Invention

The present invention relates to a semiconductor integrated circuit and a source voltage/substrate bias control circuit, as well as to a semiconductor storage device.

2. Related Background Art

Semiconductor integrated circuits have been under progressive miniaturization in recent years. Along with this movement, variance of semiconductor integrated circuits caused by their manufacturing processes has a large influence on capabilities of the semiconductor integrated circuits, and especially to their threshold values. The following documents disclose known techniques to cope with non-uniformity of threshold values of transistors in semiconductor integrated circuits.

"Solid-State Circuits" by Kuroda et al. in IEEE J., vol. 31, 1996 (pp 1770-1779) (herein below referred to as Non-patent Document 1) discloses a technique for controlling the threshold value of a transistor in operation as shown in FIG. 12. In this technique, a leak current monitor LCM monitors the substrate current $I_{chip}$ of a transistor $T_{chip}$ by way of the substrate current $I_{mon}$ of a transistor $T_{mon}$. Then, this technique controls the substrate current $I_{chip}$ by driving a substrate bias generating circuit SSB to adjust the substrate current $I_{mon}$ to a target value. Thereby, the threshold value of the transistor $T_{chip}$ in the chip can be controlled.

ISSCC Digest of Tech. Papers 1996 (pp 300-301) by Mizuno et al. (herein below referred to as Non-patent Document 2) discloses a technique for controlling both the threshold value of a transistor and the source voltage simultaneously as shown in FIG. 13. The control circuit controls VPP and VNN so that the semiconductor integrated circuit can obtain the maximum operation frequency.

ISSCC Digest of Tech. Papers, 2002 (pp 422-423) by Tschanz et al. (herein below referred to as Non-patent Document 3) discloses a technique for controlling the threshold value of a transistor as shown in FIG. 14. The substrate potential of a transistor $T_L$ is controlled to ensure that the semiconductor integrated circuit can obtain the maximum operation frequency.

Japanese Patent Laid-open Publication JP2002-111470-A (herein below referred to as Patent Document 1) discloses a circuit that can stabilize a uniform logical threshold voltage even under differences in operation source voltage and can input and output signals with reference to the logical threshold voltage. Thus, the circuit need not use an additional circuit such as a level conversion circuit between circuit blocks different in operation source voltage to transfer signals between them.

In general, a source voltage and a substrate bias used in a semiconductor integrated circuit are controlled to maintain a certain potential difference between them. Therefore, when the source voltage varies depending upon the operating condition, the substrate bias also varies while keeping the potential difference between the source voltage. The source voltage and the substrate bias are controlled in digital value. Heretofore, multipurpose DACs (digital-analogue converters) have been used to control the source voltage and the substrate bias in digital value.

The substrate bias generating circuit SSB disclosed by Non-patent Document 1 is under feedback control. Therefore, once the substrate current $I_{chip}$ increases to a large current, the substrate bias generating circuit SSB cannot follow it, and it takes time to stabilize the substrate current $I_{chip}$. In addition, the substrate bias generating circuit SSB includes a charge pump circuit CP, and the substrate current $I_{chip}$ is driven by the charge pump circuit CP as a current source. Therefore, if the substrate current $I_{chip}$ becomes a large current and it takes time to stabilize the substrate current $I_{chip}$, the transistor $T_{Chip}$ may latch up.

The technique disclosed by Non-patent Document 2 involves the problem that the voltage source and the threshold voltage of the transistor cannot be changed independently from each other because the circuit configuration changing both VPP and VNN inevitably results in changing both the source voltage and the threshold voltage simultaneously.

In the technique shown in Non-patent Document 3, since the substrate potential of the NMOS transistor $T_N$ is near the ground potential GND, it may occur that the substrate potential required for adjusting the threshold value of the NMOS transistor $T_N$ must be a negative value. Usually, however, the semiconductor integrated circuit does not include a negative source lower than the ground potential GND. Therefore, here is the problem that, while the substrate potential of the PMOS transistor $T_p$ can be generated in the semiconductor integrated circuit, the substrate potential of the NMOS transistor $T_N$ must be introduced from outside (VBNext).

The technique disclosed by Patent Document 1 merely adjusts the threshold voltage to a certain threshold voltage, and therefore involves the same problem discussed in conjunction with Non-patent Document 3.

In case a semiconductor integrated circuit relies upon DAC for controlling the source voltage and the substrate bias used therein, the circuit needs independent DACs for the control of the source voltage and the control of the substrate bias respectively. When a semiconductor integrated circuit includes a plurality of circuit blocks different in source voltage, the circuit needs independent DACs for the control of the source voltage and the substrate bias respectively in each circuit block.

SUMMARY OF THE INVENTION

A semiconductor integrated circuit according to an embodiment of the invention comprises a semiconductor substrate; a plurality of well regions formed on one surface of the semiconductor substrate and electrically isolated from each other; a plurality of MOS transistors formed in the well regions; and a substrate bias generating circuit applying substrate biases to the individual well regions based on actually measured process-derived variance of the MOS transistors in threshold voltage to bring the threshold voltages of the respective MOS transistors into conformity with a normal threshold voltage.

A semiconductor integrated circuit according to an embodiment of the invention comprises a semiconductor substrate; a plurality of well regions formed on one surface of the semiconductor substrate and electrically isolated from each other; a plurality of MOS transistors formed in the well regions; a plurality of threshold voltage measuring elements formed under the same conditions as those of the MOS transistors; and a substrate bias generating circuit for applying substrate biases to the individual well regions based on actually measured process-derived variance of the respective MOS transistors in threshold voltage to bring the threshold voltages of the respective MOS transistors into conformity with a normal threshold voltage.

A source voltage/substrate bias control circuit for controlling a source voltage applied to a semiconductor integrated circuit and a substrate bias to the source voltage, according to an embodiment of the invention comprises a constant voltage source supplying a constant voltage to the source voltage/substrate bias control circuit; a ladder resistor connected to the constant voltage source to generate a plurality of reference voltages from the voltage of the constant voltage source; a plurality of first selector circuits connected to the ladder resistor to input a first digital value indicative of a relation between the source voltage and the substrate bias, said first selector circuits selecting one of the reference voltages as a candidate of the substrate bias based on the first digital value; and a second selector circuit connected to the ladder resistor to input a second digital value indicative of the source voltage, said second selector circuit outputting a first reference voltage among said reference voltages as the source voltage to the semiconductor integrated circuit based on the second digital value, and selecting a substrate bias circuit from said first selector circuits based on the second digital value, said substrate bias circuit outputting the substrate bias to the semiconductor integrated circuit.

DETAILED DESCRIPTION OF THE INVENTION

Some embodiments of the present invention will now be explained below with reference to the drawings. These embodiments, however, should not be construed to limit the invention.

Explanation will start with semiconductor integrated circuits embodying the invention. Semiconductor integrated circuits embodying the present invention each include a substrate bias generating circuit for supplying a substrate bias based upon the threshold voltage actually measured in the manufacturing process of a MOS transistor. Thus, the semiconductor integrated circuits can adjust the threshold voltage of the MOS transistor to a predetermined value without the use of a feedback circuit or an external source exclusive for the substrate bias.

First Embodiment

Figure 1:
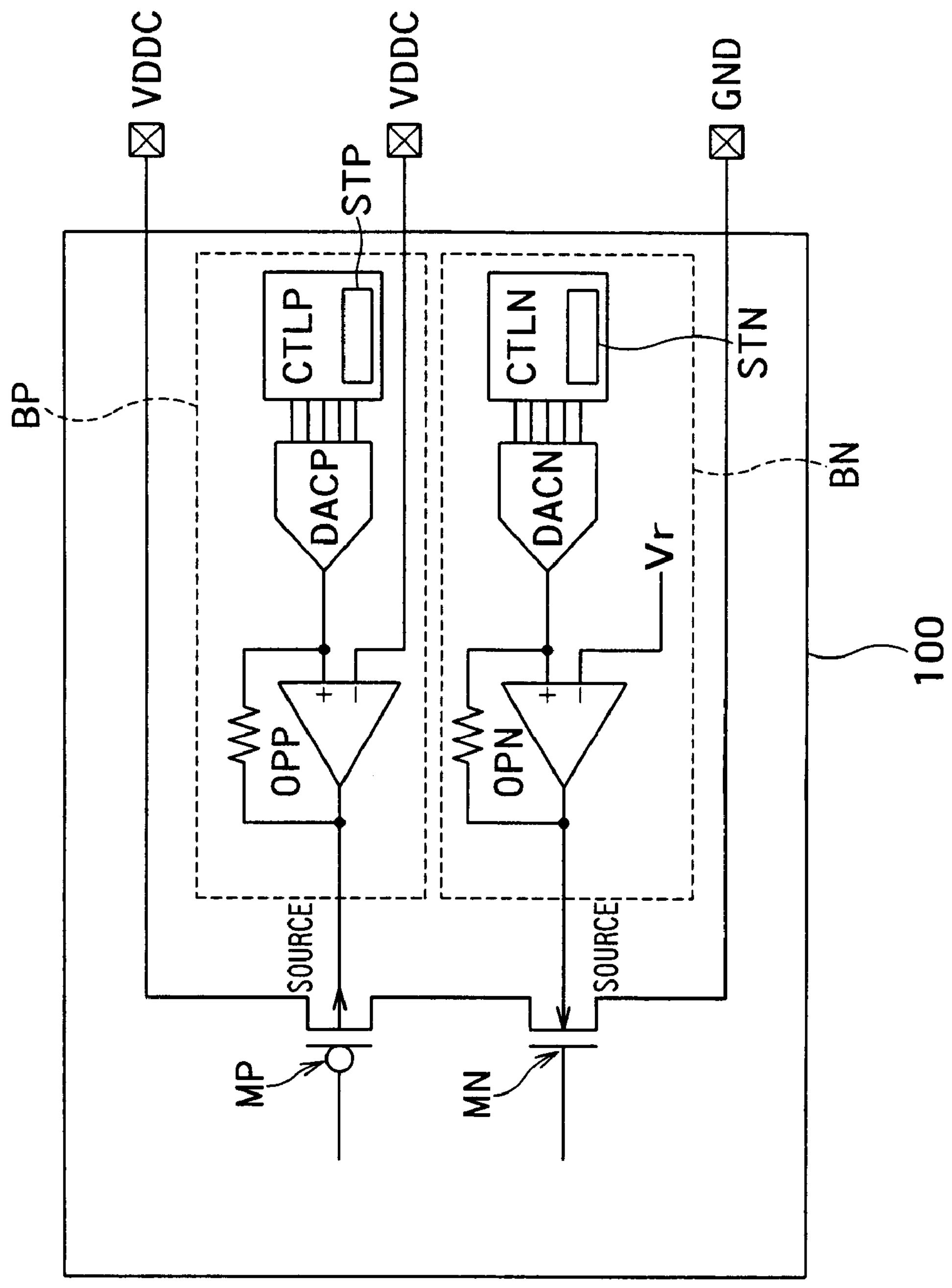
FIG. 1 is a block diagram of LSI 100 according to the first embodiment of the invention.

FIG. 1 is a block diagram of LSI 100 according to the first embodiment of the invention. LSI 100 includes a P-type MOS transistor MP (herein below, also referred to as the transistor MP), an N-type MOS transistor MN (herein below, also referred to as the transistor MN), a substrate bias generating circuit BP (herein below, also referred to as the bias generating circuit BP), and a substrate bias generating circuit BN (herein below, also referred to as the bias generating circuit BN).

Figure 2:
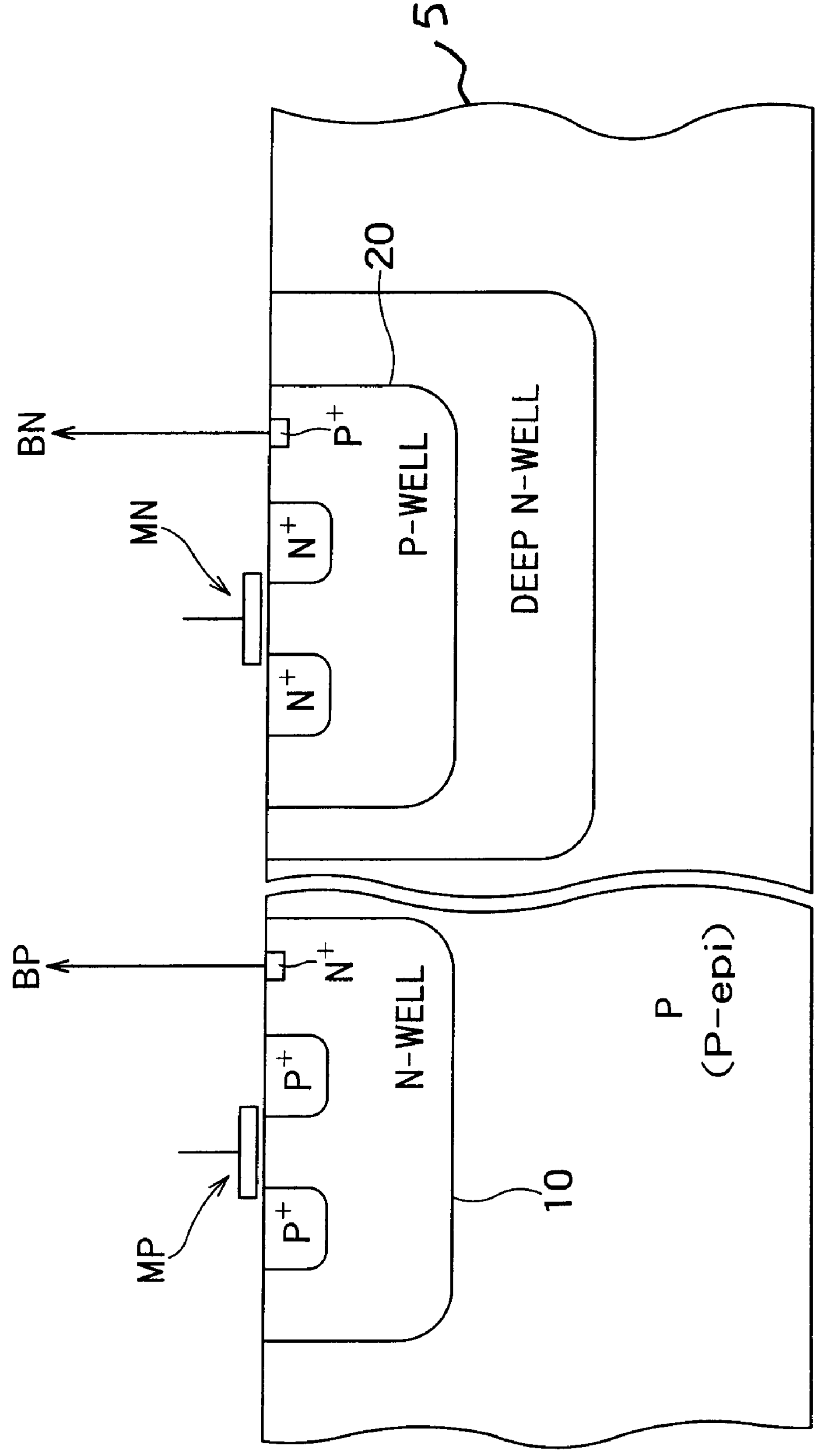
FIG. 2 is a schematic cross-sectional view of a transistor MP and a transistor MN.

FIG. 2 is a schematic cross-sectional view of the transistor MP and the transistor MN. Both the transistor MP and the transistor MN are formed on the top surface of a substrate 5. The transistor MP is formed in an N-type well region 10. The transistor MN is formed in a P-type well region 20. An isolation (not shown) is formed between the N-well region 10 and the P-well region 20 to insulate them from each other.

FIG. 2 shows only one well region 10 and only one well region 20. Actually, however, a plurality of well regions 10 and a plurality of well regions 20 are formed. These N-well regions 10 are isolated from each other, and the P-well regions 20 are isolated from each other. FIG. 2 shows only one transistor MP in the well region 10 and only one transistor MN in the well region 20, respectively. However, each N-well region 10 and each P-well region 20 may include a plurality of transistors MP and MN, respectively.

One bias generating circuit BN is provided for each P-well region 20, and one bias generating circuit BP is provided for each N-well region 10. Thus, the bias generating circuit BP and the bias generating circuit BN can supply substrate bias voltages to the transistor MP and the transistor MN, respectively.

The source voltage introduced from outside of LSI 100 is VDDC. The ground GND is the ground potential. The ground GND is connected to the source of the transistor MN. The external source VDDC is connected to the source of the transistor MP and supplies a voltage higher than the ground GND.

The bias generating circuit BP includes an operational amplifier OPP, DA converter DACP and control circuit CTLP. The bias generating circuit BN includes an operational amplifier OPN, DA converter DACN and control circuit CTLN. The input voltage Vr employed as the reference of the operational amplifier OPN is higher than the voltage of the ground GND. The control circuits CTLN and CTLP include storage portions STN and STP, respectively.

Variance in threshold voltage of transistors MN and MP occurs in their manufacturing process. These threshold voltages of transistors including process-derived variance are actually measured in the manufacturing process (by a wafer test), and the instant embodiment uses data obtained by the actual measurement to determine the substrate bias values to be added to the well regions 10 and 20 respectively.

In general, transistors formed in identical wells within a narrow region will have substantially the same characteristics. As the distance between the wells increases, the transistors MN and MP are subject to larger and larger variance in threshold voltage among respective well regions. On this account, this embodiment provides one bias generating circuit BN for each P-well region 20 to apply a predetermined substrate bias for each P-well region 20, and provides one bias generating circuit BP for each N-well region 10 to supply a predetermined substrate bias to each N-well region 10.

The storage portions STN and STP store beforehand certain substrate bias values determined based on process-derived variance in threshold voltage actually measured in the manufacturing process of the transistors MN and MP. The storage portions STN and STP may be fuses or nonvolatile memory devices, for example. The control circuits CTLN and CTLP transmit digital signals as information on the substrate bias values stored in the storage portions STN and STP to DA converters DACN and DACP, respectively. The DA converters DACN and DACP each generate a substrate bias based on the supplied digital signal. The operational amplifier OPN is used to supply the substrate bias under low output impedance. As such, the bias generating circuits BP and BN each apply the substrate bias to the associated substrate region 10 or 20.

The illustrated embodiment uses storage portions STN and STP formed inside the LSI 100. However, the storage portions STN and STP may be formed outside the LSI 100. In this case, the LSI 100 can be reduced in size.

Figure 3:
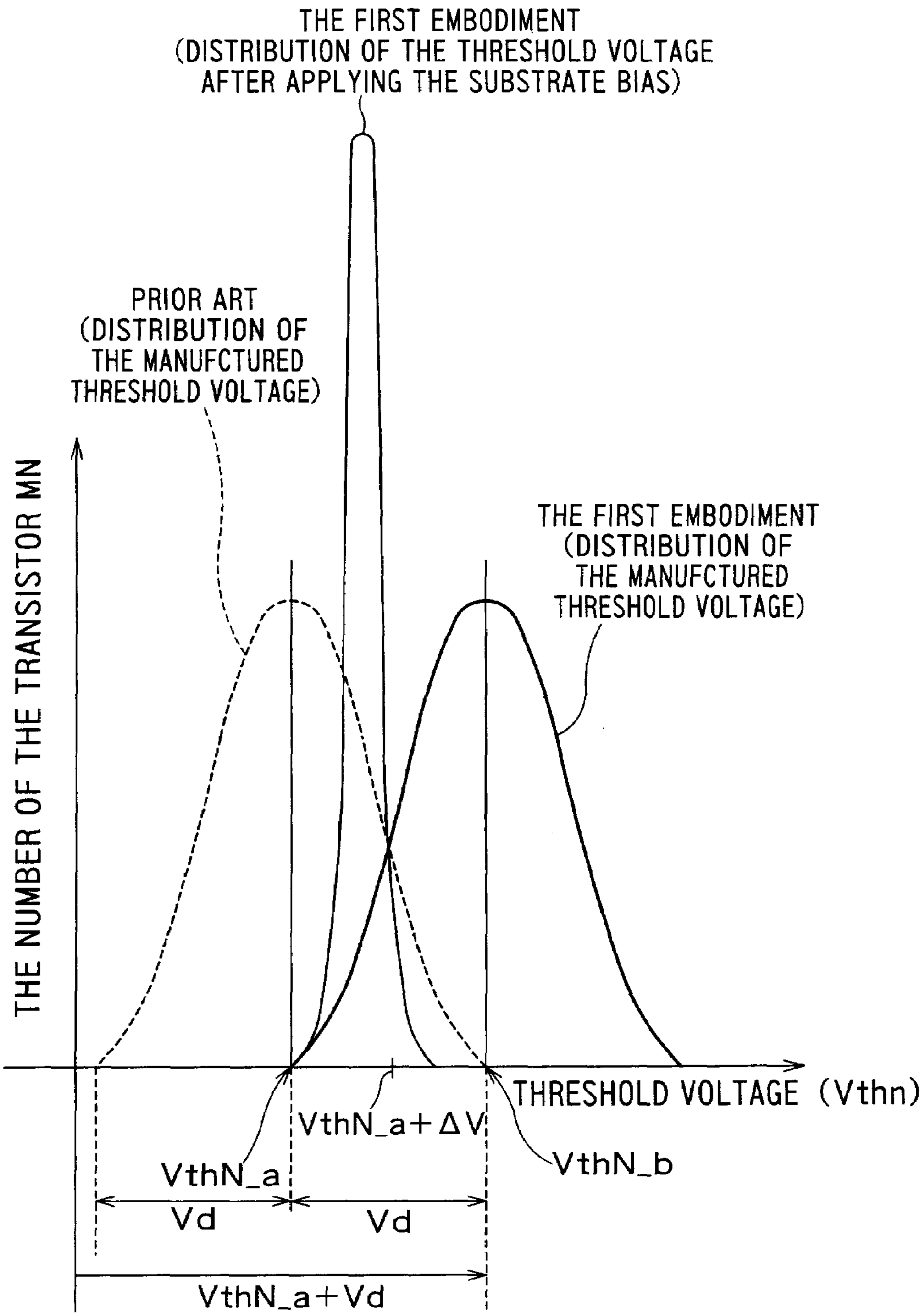
FIG. 3 is a graph showing fluctuations of threshold voltages of N-type transistors according to a prior art and an embodiment of the invention.

FIG. 3 is a graph showing statistical distribution of the threshold voltage of the transistor MN. With reference to FIG. 3, a target of the threshold voltage in the manufacturing process of the transistor MN will be explained below.

In conventional techniques, the normal threshold voltage for operating the transistor MN (herein below, simply referred to as the normal threshold voltage VthN_a) was directly targeted as the threshold voltage of the transistor MN as manufactured (herein below, referred to as the manufactured threshold voltage). Actually, however, transistors as manufactured are variable in threshold voltage depending upon their manufacturing conditions. Here is assigned Vd to the voltage width corresponding to one half of the variance. If there is a variance as large as ±Vd from the normal threshold voltage VthN_a, the manufactured threshold voltage may be even lower than the ground voltage. This causes the problem discussed in conjunction with Non-patent Document 3.

In this embodiment, the threshold voltage of the transistor MN targeted in the manufacturing process is a modified threshold voltage VthN_b that is higher by a correction voltage than the normal threshold voltage VthN_a. Let this correction voltage be a voltage equal to or higher than the voltage width Vd in this embodiment. Thus, even when the variance is as large as the voltage width Vd from the correction threshold voltage VthN_b, the manufactured threshold voltage of any transistor MN becomes the normal threshold voltage VthN_a or more. Since all manufactured threshold voltages of transistors MN are higher than or equal to the normal threshold voltage VthN_a, the bias generating circuit BN can adjust the threshold voltage, as manufactured, of any transistor MN to the normal threshold voltage VthN_a by applying a substrate bias higher than the ground voltage to the substrate region 20.

Variance in threshold voltage is a process-derived error produced in the manufacturing process of the transistors, and such process-derived errors are inherent to individual manufacturing lines. Since the process-derived errors are statistically calculated from measurement of threshold voltages of transistors manufactured in the past, they are known values.

For example, in case the manufactured threshold voltage of a certain transistor MN is $VthN\_a+\Delta V$ ($0 \leqq \Delta V \leqq 2*Vd$), the substrate bias may be adjusted to a positive voltage based upon the voltage ΔV. The bias generating circuit BN applies a substrate bias to PN junctions between $N^+$ sources of transistors MN and P-well regions in the forward direction to a level not exceeding the built-in potential voltage. Since the voltage ΔV is larger than or equal to 0, the substrate bias becomes a value not lower than the ground voltage. Since the substrate bias is a positive voltage, the embodiment does not need a voltage source lower than the ground voltage.

The bias generating circuit BN shown in FIG. 1 operates as explained below to apply the substrate bias. Beforehand, manufactured threshold voltages of individual transistors MN as manufactured by targeting the modified threshold voltage VthN_b are measured. In the instant embodiment, the substrate bias is calculated from differences between the manufactured threshold voltage of each transistor and the normal threshold voltage, and the substrate bias value is stored in the storage portion STN in a digital value. The DA converter DACN having received the digital signal from the control circuit CTLN applies the substrate bias to the substrate region 20 via the operational amplifier OPN to amend the manufactured threshold voltage of the transistor MN to be approximately equal to the normal threshold voltage for operation of the transistor MN. As a result, the threshold voltage of the transistor MN can be brought into conformity with the normal threshold voltage.

In the instant embodiment, the operational amplifier OPN may be an amplifier or a buffer to modify the output of the DA converter DACN to an appropriate substrate bias.

The control circuit CTLN may include a circuit for measuring the threshold voltage. The circuit for measuring the threshold voltage may be a monitor transistor (not shown) built in the substrate region 20, for example. The monitor transistor is not limited in size, but must be manufactured under the same process conditions as those of the transistor MN to ensure that the threshold voltage thereof is equal to the manufactured threshold voltage of the transistor MN. Once the monitor transistor is measured, the threshold voltage of the transistor MN need not be measured.

To ensure that the manufactured threshold voltage is larger or equal to the threshold voltage VthN_a, the correction voltage may be higher than the voltage width Vd. Needless to say, the voltage width Vd varies depending upon the process-derived errors inherent to individual semiconductor manufacturing lines.

Figure 14:
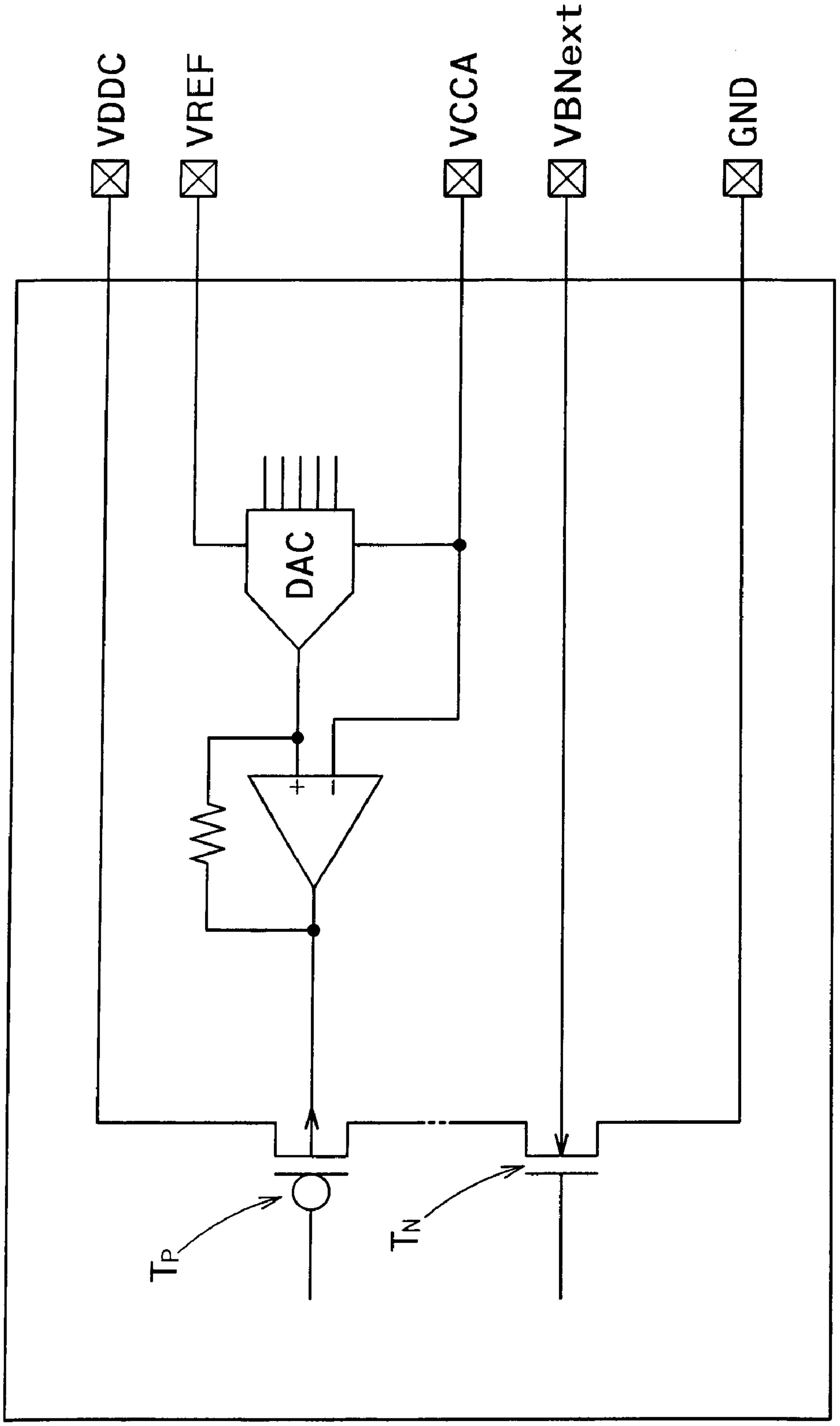
PRIOR ART FIG. 14
FIG. 14 is a diagram related to Non-patent Document 3.

According to the embodiment, since the threshold voltages of both transistors MN and MP are adjusted to the normal threshold voltage in operation, voltages generated in the DA converter DACN and DACP can be used as substrate bias values. That is, unlike the conventional technique shown in FIG. 14, the instant embodiment need not introduce an external voltage source for a voltage lower than the ground voltage.

Figure 13:
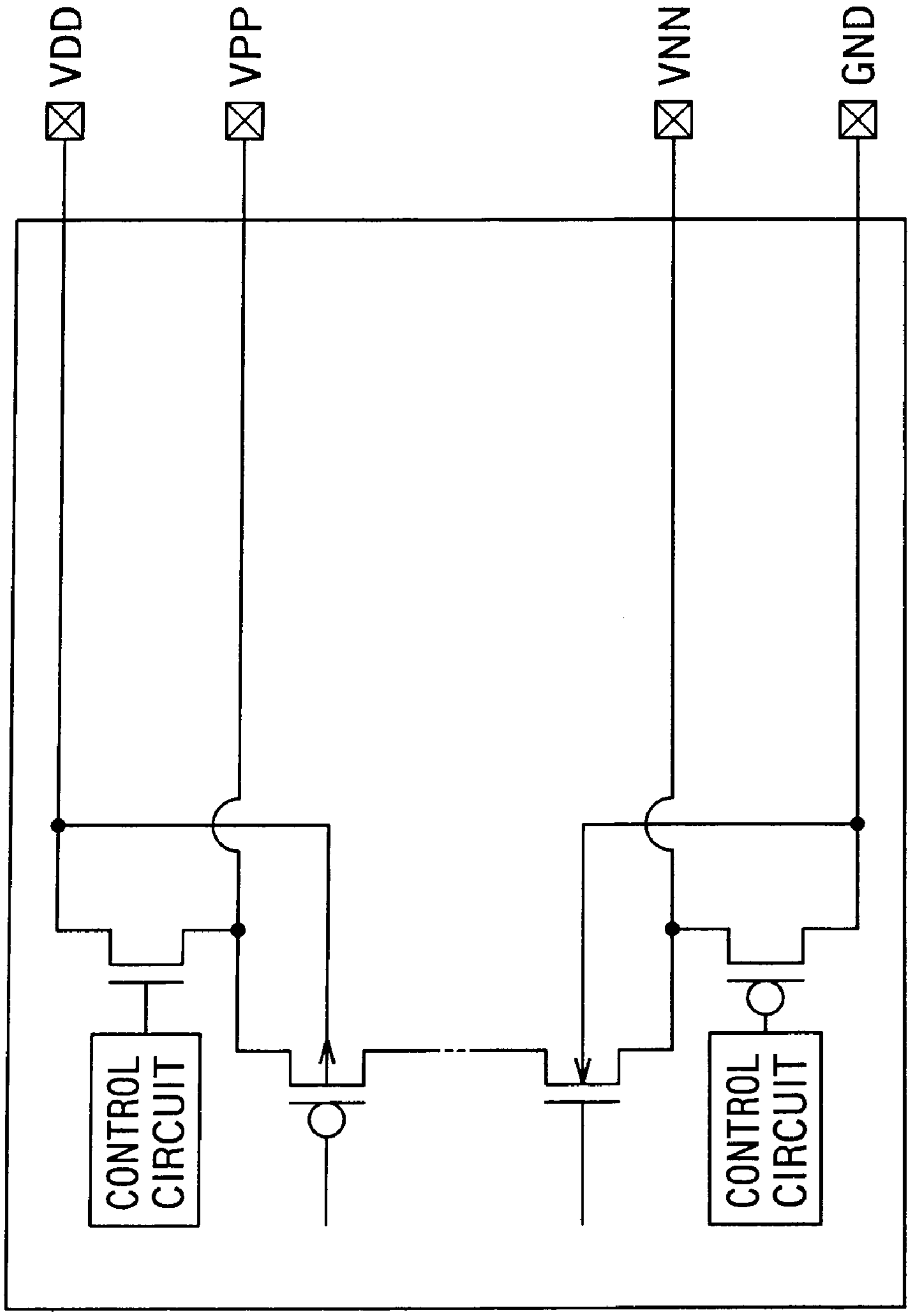
PRIOR ART FIG. 13
FIG. 13 is a diagram related to Non-patent Document 2.

According to the instant embodiment, there is a large potential difference between the source of the transistor MN and the source of the transistor MP. Therefore, the potential difference between the gate voltage of the transistor MN in operation and the gate voltage of the transistor MP in operation is larger than that in the conventional technique shown in FIG. 13. This means that the transistors MN and MP can operate in wider operative ranges. This contributes to preventing wrong operations of the transistors MN and MP.

Furthermore, in the instant embodiment, because of the large potential difference between the source of the transistor MN and the source of the transistor MP, the source VDDC or ground GND can electrically charge and discharge the load capacitance (not shown) connected between the transistors MN and MP more quickly.

According to the instant embodiment, by controlling the threshold voltages of the transistors MN and MP to minimize their variance, the leak current in the sleep mode of the transistors MN and MP can be reduced.

Second Embodiment

Figure 4:
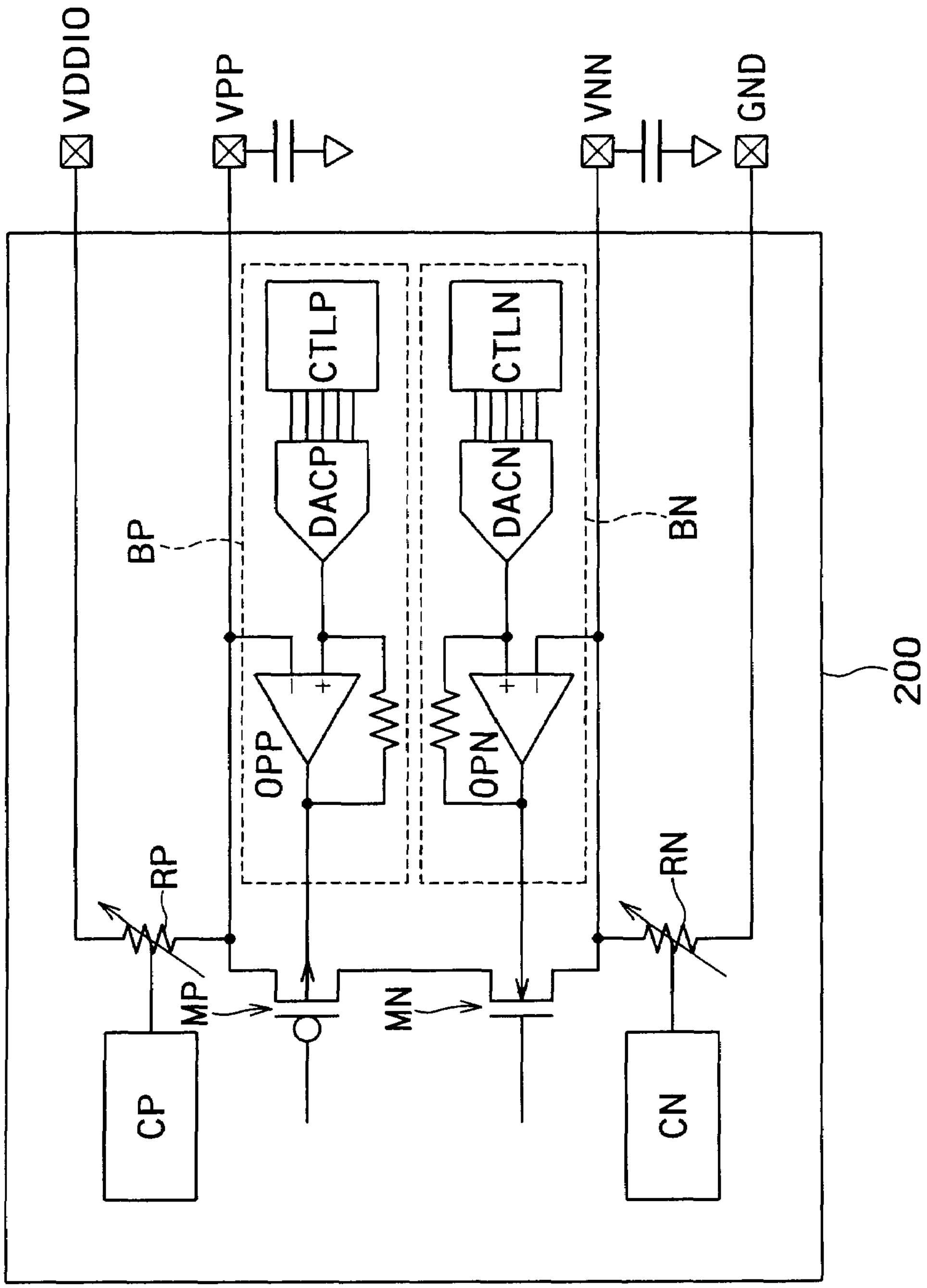
FIG. 4 is a block diagram of LSI 200 according to the second embodiment of the invention.

FIG. 4 is a block diagram of LSI 200 according to the second embodiment of the invention. In the second embodiment, the transistor MN is manufactured targeting the normal threshold voltage VthN_a. The LSI 200 includes resistance components RN and RP and control circuits CN and CP for controlling them. These are differences of the second embodiment from the first embodiment, and configurations of the bias generating circuits BN and BP are identical to those of the first embodiment.

The resistance component RN is connected in series between the ground GND and the source of the transistor MN. The resistance component RP is connected in series between the source VDDIO and the source of the transistor MP. These resistance components RN and RP are variable resistors, and may be comprised of MOS transistors. FIG. 4 illustrates only one resistance component RN and only one resistance component RP. Actually, however, they are provided in a plurality of substrate regions 20 and a plurality of substrate regions 10, respectively. Respective resistance components RN are approximately equal in resistance value. Respective resistance components RP may be approximately equal or different in resistance value.

Since the respective resistance components RN are approximately equal in resistance value, once the control circuit CN controls the current flowing into the resistance component RN, the voltage VNN at the source is maintained at a modified source voltage higher than the ground GND by a correction voltage in all transistors MN. The control circuit CN controls the resistance component RN to maintain the voltage VNN at the modified source voltage. In the second embodiment, the correction voltage is higher than or equal to the voltage width Vd (see FIG. 3). Thus, the modified source voltages of the respective transistors MN are higher than or equal to the voltage Vd. Therefore, the bias generating circuit BN can adjust individual transistors MN to the normal threshold voltage VthN_a by applying a substrate bias higher than the ground GND to the substrate region 20. That is, the second embodiment need not use a power source for supplying a negative voltage lower than the ground GND.

To simplify the circuit arrangement, a single resistance component RN may be used commonly for a plurality of substrate regions 20. To ensure that the substrate bias is higher than the ground GND, the correction voltage may be higher than the voltage width Vd.

A current flowing to the resistance component RP results in maintaining the source voltage VPP of the transistor MP in a voltage level lower than the power source VDDIO by the correction voltage. Since the resistance values of individual resistance components RP may be different from each other, and the voltage VPP may be selected as desired. As a result, the second embodiment can make a large potential difference between the source of the transistor MN and the source of the transistor MP. That is, the second embodiment ensures the same effects as those of the first embodiment.

In addition, the second embodiment can reduce the potential difference between the source of the transistor MN and the source of the transistor MP, depending upon the size of the resistance component RP, and this contributes to reducing the consumption power.

Third Embodiment

The third embodiment of the invention is next explained with reference to FIG. 4. In this embodiment, the transistor MN is manufactured, targeting an amended threshold voltage lower than the normal threshold voltage VthN_a by a first correction voltage. This is a difference of the third embodiment from the second embodiment. In this third embodiment, the first correction voltage is larger than or equal to the voltage width Vd (see FIG. 3). Thus, the manufactured threshold voltage of the transistor MN is equal to or lower than the ground voltage.

The control circuit CN controls the resistance component RN to maintain the voltage VNN at a level higher by a second correction voltage than the ground GND. In this embodiment, the second correction voltage is 2*Vd or more, and the threshold voltage of the transistor MN is assured to be equal to or higher than the ground voltage and lower than or equal to VNN.

Therefore, according to the third embodiment, the bias generating circuit BN can adjust the threshold voltage of the transistor MN to the normal threshold voltage by generating a substrate bias in the range from the ground GND to VNN, and assures the same effects as those of the second embodiment.

Even when the second and third embodiments are modified by replacing the resistance components RN and RP by a series regulator capable of controlling the voltage, the same effects can be obtained.

Although the first to third embodiments have been explained regarding the transistor MN, the same explanation is applicable to the transistor MP as well. In this case, however, the "threshold voltage" should read the "absolute value of the threshold voltage", and the "ground GND" and "ground voltage" should read the "source voltage VDD".

Figure 5:
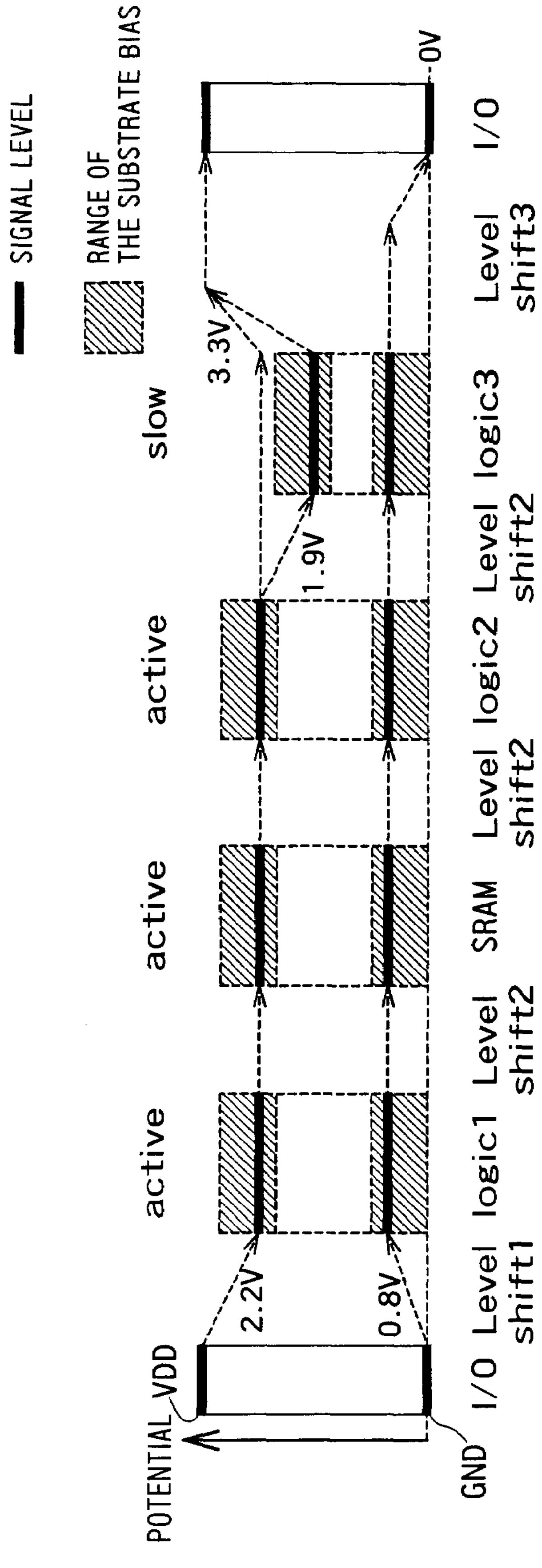
FIG. 5 is a diagram showing the signal level appearing when LSI 100 is in operation.
Figure 6:
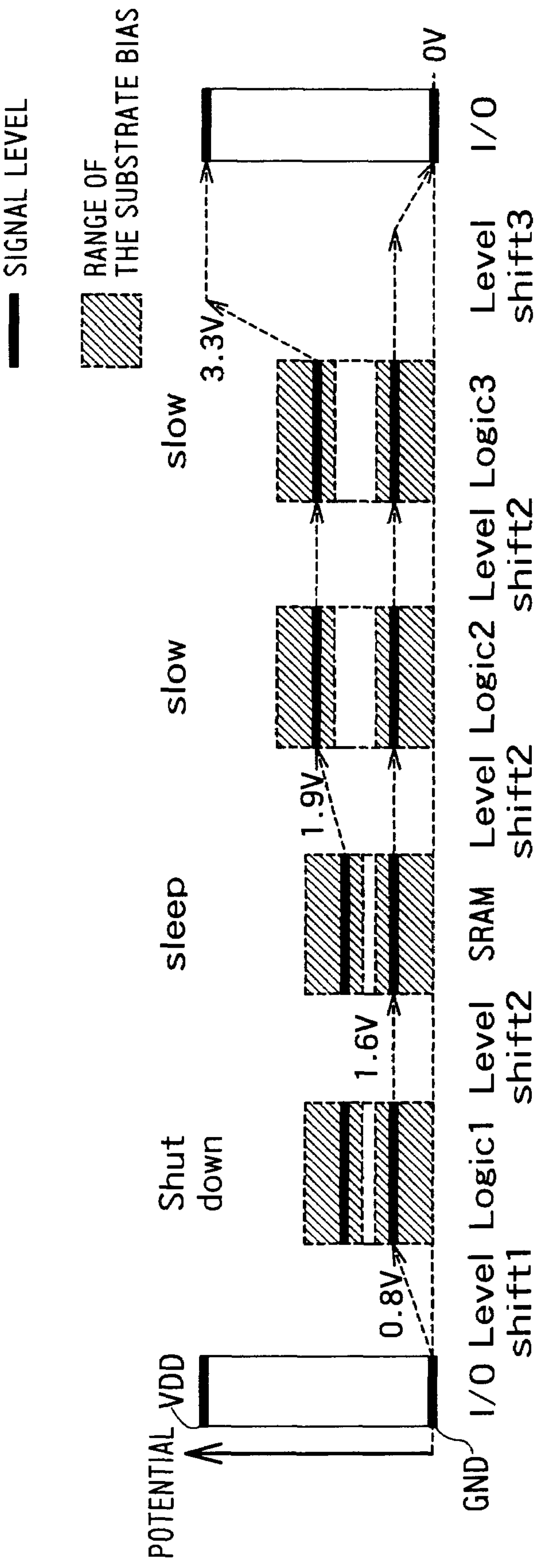
FIG. 6 is a diagram showing the signal level appearing when LSI 100 is in operation.

FIGS. 5 and 6 are diagrams showing signal levels inside LSIs according to the first to third embodiments. FIG. 5 shows signal levels in LSIs in operation, and FIG. 6 shows signal levels in LSIs in the sleep mode. Both these diagrams show signal levels in logic circuit Logic 1, Logic 2, Logic 3 and memory SRAM built into each LSI. The logic circuits Logic 1, Logic 2, Logic 3 and memory SRAM comprise transistors MN and MP, respectively. The symbol I/O indicates the voltage levels of the ground GND and the source voltage VDD.

For example, the logic circuit Logic 3 shown in FIG. 5 needs a power source of a potential difference different from those of the other circuits inside the LSI. In this case, the first to third embodiments may simply change the signal level only of the power source VDD while maintaining the signal level of the ground GND in the each circuit. This is applicable also in the sleep mode of LSI 100 as shown in FIG. 6.

Some embodiments of the power source/substrate bias control circuit according to the invention will be explained below. The power source/substrate bias control circuit according to any of the embodiments of the invention selects a source voltage VDD from a plurality of reference voltages based on the higher bits of a control-purpose digital value, and decides a potential difference between the source voltage VDD and a substrate bias VBB on the basis of the lower bits of the control-purpose digital value. The power source/substrate bias control circuit can, thereby, control the source voltage while maintaining the relation between the source voltage and the substrate bias.

For example, a selected voltage is supplied to LSI according to any of the first to third embodiments. The substrate bias VBB is used for adjusting the threshold voltage of transistors in LSI according to any of the first to third embodiments.

Fourth Embodiment

Figure 7:
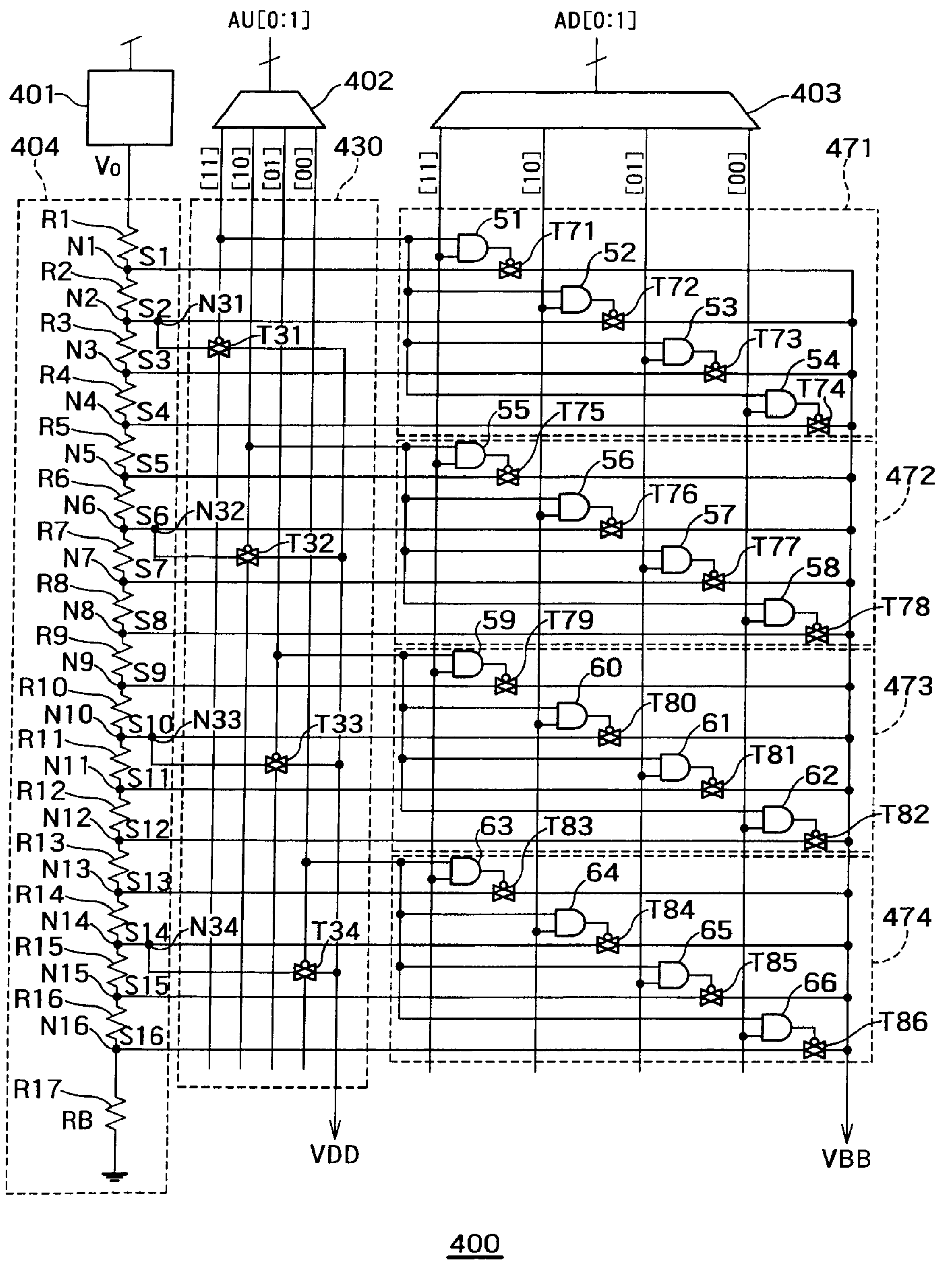
FIG. 7 is a circuit diagram of a control circuit 400 according to the fourth embodiment of the invention.

FIG. 7 is a circuit diagram of a power source/substrate bias control circuit 400 (herein below, simply referred to as the control circuit 400) according to the fourth embodiment of the invention. The control circuit 400 includes a constant voltage circuit 401, decoder circuit 402, decoder circuit 403, ladder resistor 404, source voltage selecting circuit 430 and substrate bias selecting circuits 471~474.

The constant voltage circuit 401 is powered by the power source to output a constant voltage $V_0$. The ladder resistor 404 includes resistors R1~R17 serially connected between the constant voltage circuit 401 and the ground GND. The ladder resistor 404 divides the constant voltage $V_0$ by the resistors R1~R17 to produce reference voltages S1~S16. Any number of reference voltages can be produced by using a corresponding number of resistors.

The decoder circuits 402, 403 decode a control signal AU of the high two bits of a four-bit digital control signal and a control signal AD of the low two bits of the digital control signal, respectively. The control signal AU is used to control the source voltage VDD depending upon the operation mode of LSI 100 powered by the control circuit 400. The control signal AD is used to control the substrate bias VBB with relation to the source voltage VDD. For example, the control signal exhibits a potential difference between the substrate bias VBB for adjusting the threshold voltage of the transistor in the LSI 100 and the source voltage VDD.

The source voltage selecting circuit 430 includes switching transistors T31~T34 (herein below, simply referred to as transistors T31~T34). The source voltage selecting circuit 430 is connected to the ladder resistor 404 and the decoder circuit 402. Transistors T31~T34 are connected to different reference voltages respectively. In this embodiment, the transistor T31 is connected to the reference voltage S2, transistor T32 to the reference voltage S6, transistor T33 to the reference voltage S10, and transistor T34 to the reference voltage S14. Gates of the transistors T31~T34 are supplied with a digital signal outputted from the decoder circuit 402. Depending upon the digital signal, one of the transistors T31~T34 turns on. Thus, the source voltage selecting circuit 430 can output a reference voltage based on the control signal AU as the source voltage VDD. In this embodiment, the source voltage selecting circuit 430 selectively outputs one of reference voltages S2, S6, S10 and S14.

The substrate bias selecting circuit 471 includes AND circuits 51~54 and switching transistors T71~T74 (herein below, simply referred to as transistors T71~T74). The substrate bias selecting circuit 472 includes AND circuits 55~58 and switching transistors T75~T78 (herein below, simply referred to as transistors T75~T78). The substrate bias selecting circuit 473 includes AND circuits 59~62 and switching transistors T79~T82 (herein below, simply referred to as transistors T79~T82). The substrate bias selecting circuit 474 includes AND circuits 63~66 and switching transistors T83~T86 (herein below, simply referred to as transistors T83~T86).

In this fourth embodiment, transistors T71~T86 are connected to different reference voltages S1~S16. Gates of the transistors T71~T86 are connected to outputs of the AND circuits 51~66.

In each of the AND circuits 51~66, one of two inputs is supplied with a digital signal based upon the control signal AD from the decoder circuit 402. The other input is supplied with a digital signal based upon the control signal AU from the decoder circuit 403.

In case of this embodiment, in each of the AND circuits 51~54, one of two inputs is supplied with a digital signal [11] from the decoder circuit 402. In each of the AND circuits 55~58, one of two inputs is supplied with a digital signal [10]. In each of the AND circuits 59~62, one of two inputs is supplied with a digital signal [01]. In each of the AND circuits 63~66, one of two inputs is supplied with a digital signal [00]. Thereby, one of the substrate bias selecting circuits 471~474 is selected based on the control signal AU.

The other inputs of the AND circuits 51~66 are supplied with digital signals [11], [10], [01] and [00] from the decoder circuit 403. Thereby, one of the switching transistors in each substrate bias selecting circuit is selected based on the control signal AD.

As such, the fourth embodiment is configured to select a source voltage VDD and a substrate bias selecting circuit based on the control signal AU and to select a switching transistor in the substrate bias selecting circuit based on the control signal AD. Therefore, the control circuit 400 can output a source voltage VDD based upon the control signal AU and a substrate bias VBB based upon the control signals AU and AD.

In case the control signal AU is [10], the transistor T32 in the source voltage selecting circuit 430 turns on. Therefore, the source voltage selecting circuit 430 outputs the reference voltage S6 as the source voltage VDD. In case the control signal AU is [10], the bias selecting circuit 472 is selected, a high-level signal is input to one of inputs in each AND circuit 55~58.

If the control signal AD is [01], then the transistor T77 turns on in the bias selecting circuit 472. Therefore, the bias selecting circuit 472 outputs the reference voltage S7 as the substrate bias VBB.

In case the control signal AD is fixed to [01] and the control signal AU is changed, the source voltage VDD changes to one of the reference voltages S2, S6, S10 or S14. If the control signal AU changes to [11], then the reference voltage S2 is outputted as the source voltage VDD, and the voltage S3 is outputted as the substrate bias VBB. If the control signal AU changes to [01], then the reference voltage S10 is outputted as the source voltage VDD, and the voltage S11 is outputted as the substrate bias VBB. If the control signal AU changes to [00], then the reference voltage S14 is outputted as the source voltage VDD, and the voltage S15 is outputted as the substrate bias VBB. As such, the substrate bias VBB changes while maintaining a potential difference down by one level from the source voltage VDD. That is, the fourth embodiment can change the source voltage VDD and the substrate bias VBB while maintaining a constant potential difference between them (see FIGS. 10 and 11).

In order to modify the reference voltages the source voltage VDD can output, connection of transistors T31~T34 to reference voltages may be changed. For example, if the nodes N31~N34 between the transistors T31~T34 and the ladder resistor 404 are connected to other positions of the ladder resistor 404, the source voltage VDD can output other desired reference voltages.

In order to modify the reference voltages that the substrate bias VBB can output, connection of the transistors T71~T86 to reference voltages may be changed.

Fifth Embodiment

Figure 8:
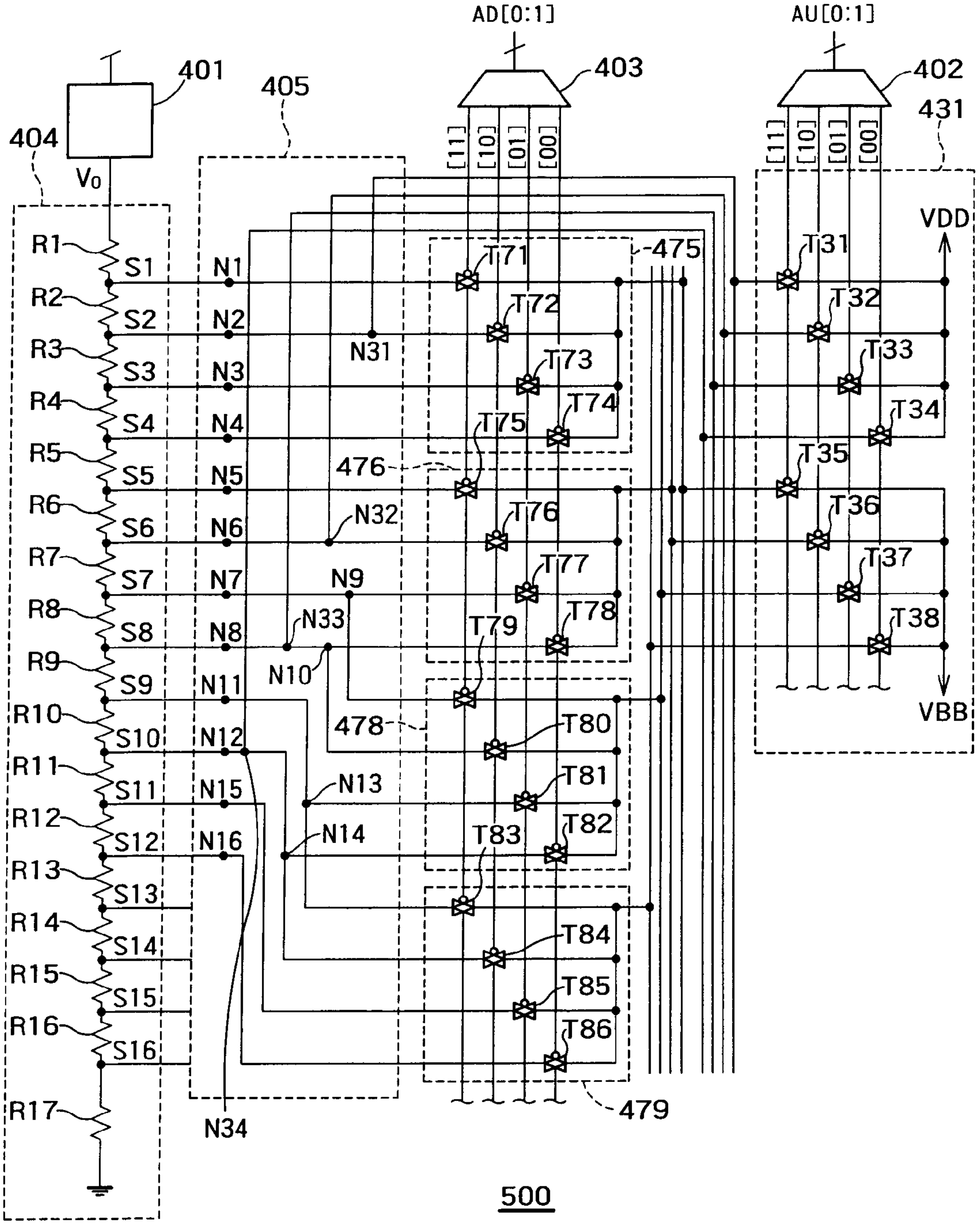
FIG. 8 is a circuit diagram of a control circuit 500 according to the fifth embodiment of the invention.

FIG. 8 is a circuit diagram of a source voltage/substrate bias control circuit 500 (herein below, simply referred to as the control circuit 500) according to the fifth embodiment of the invention. The control circuit 500 includes a constant voltage circuit 401, decoder circuit 402, decoder circuit 403, ladder resistor 404, source voltage selecting circuit 431 and substrate bias selecting circuits 475~479.

Similarly to the source voltage selecting circuit 430 in the fourth embodiment, the source voltage selecting circuit 431 in the fifth embodiment includes transistors T31~T34. The source voltage selecting circuit 431 further includes switching transistors T35~T38 (herein below, simply referred to as the transistors T35~T38) that are used for selecting the substrate bias selecting circuits 475~479.

Similarly to the substrate bias selecting circuit 471~474 in the fourth embodiment, the substrate bias selecting circuits 475~479 in the fifth embodiment includes transistors T71~T86. However, the substrate bias selecting circuits 475~479 do not include AND circuits, unlike the substrate bias selecting circuits 471~474 in the fourth embodiment. Since the substrate bias selecting circuits 475~479 are selected by the transistors T35~T38, they need no AND circuits.

A customizable region 405 is a wiring region for determining connections of transistors T31~T38 and T71~T86 to the ladder resistor 404. Depending upon the wiring in the customizable region 405, the source voltage VDD and the substrate bias VBB can be determined from among the reference voltages S1~S16.

The reference voltage selectable as the source voltage VDD is determined by connecting positions of the nodes N31~N34. In this fifth embodiment, one of reference voltages S2, S6, S8 or S10 can be selected as the source voltage VDD. The reference voltage selectable as the substrate bias VBB is determined by connecting positions of the nodes N1~N16. In this embodiment, one of reference voltages S1~S12 can be selected as the source voltage VBB.

The source voltage selecting circuit 431 selects one of transistors T31~T34 and one of transistors T35~T38 based on the control signal AU. If the control signal AU is [11], then the source voltage selecting circuit 431 selects the transistor T31 and the transistor T35. The source voltage selecting circuit 431 selects transistors T32 and T36 when the control signal AU is [10], selects transistors T33 and T37 when the control signal AU is [01], and selects transistors T34 and T38 when the control signal AU is [00].

Thus, the source voltage selecting circuit 431 can output one of reference voltages S2, S6, S8 or S10 as the source voltage VDD. In addition, the source voltage selecting circuit 431 can select one of substrate bias selecting circuits 475~479. For example, in FIG. 8, if the control signal AU is [11], the reference voltage S2 is selected as the source voltage VDD, and the substrate bias selecting circuit 475 is selected. Therefore, one of the reference voltages S1~S4 can be selected as the substrate bias VBB. If the control signal AU is [10], then the reference voltage S6 is selected as the source voltage VDD, and the substrate bias selecting circuit 476 is selected. If the control signal AU is [01], the reference voltage S8 and the substrate bias selecting circuit 478 are selected. If the control signal AU is [00], then the reference voltage S10 and the substrate bias selecting circuit 479 are selected.

The substrate bias selecting circuits 475~479 select transistors from the substrate bias selecting circuits 475~479 pursuant to the control signal AD. In case the control signal AD is [11], the substrate bias selecting circuits 475~479 select transistors T71, T75, T79 and T83 respectively. When the control signal AD is [10], they select T72, T76, T80 and T84 respectively. When the control signal AD is [01], they select transistors T73, T77, T81 and T85 respectively. When the control signal AD is [00], they select transistors T74, T78, T82, and T86 respectively.

As such, the fifth embodiment is configured to select a switching transistor in the substrate bias selecting circuit by means of the control signal AD and select a source voltage VDD and a substrate bias selecting circuit by means of the control signal AU. Therefore, the control circuit 500 can output a substrate bias VBB having a certain potential difference from the source voltage VDD pursuant to the control signals AD and AU and output a source voltage VDD based on the control signal AU.

In case the control signal AD is [01] for example, transistors T73, T77, T81 and T85 turn on. In addition, if the control signal AU is [10], transistors T32 and T36 turn on in the source voltage selecting circuit 431. Therefore, the source voltage selecting circuit 431 outputs the reference voltage S6 as the source voltage VDD. Further, since the transistor T36 is on, the bias selecting circuit 476 is selected. Therefore, the bias selecting circuit 476 outputs the reference voltage S7 as the substrate bias VBB.

In case the control signal AD is fixed in [01] and the control signal AU is changed, the source voltage VDD changes to the reference voltage S2, S8 or S10. If the control signal AU changes to [11], then the source voltage VDD outputs the reference voltage S2. In this case, since the transistor T35 turns on, the transistor T73 in the bias selecting circuit 475 is selected, and the voltage S3 is output as the substrate bias VBB. If the control signal AU changes to [01], the source voltage VDD outputs the reference voltage S8. In this case, since the transistor T37 turns on, the transistor T81 in the bias selecting circuit 478 is selected, and the voltage S9 is output as the substrate bias VBB. If the control signal AU changes to [00], the source voltage VDD outputs the reference voltage S10. In this case, since the transistor T38 turns on, the transistor T85 in the bias selecting circuit 479 is selected, and the voltage S11 is output as the substrate bias VBB. In this manner, the substrate bias VBB changes while keeping a potential difference down by one level from the source voltage VDD. That is, the fifth embodiment can change the source voltage VDD and the substrate bias VBB while maintaining a constant potential difference between them (see FIGS. 10 and 11).

The fifth embodiment has the same effects as those of the fourth embodiment. In addition, when a plurality of source voltage selecting circuits 431 are provided as shown in FIGS. 9, the fifth embodiment will be able to supply a source voltage VDD and a substrate bias VBB to each of a plurality of blocks in the LSI.

Both the fourth and fifth embodiments operate based upon four-bit control signals. However, they may be modified to operate under control signals of less or more bits. In this case, transistors, AND circuits, wirings, and so on, must be changed in number.

Figure 9:
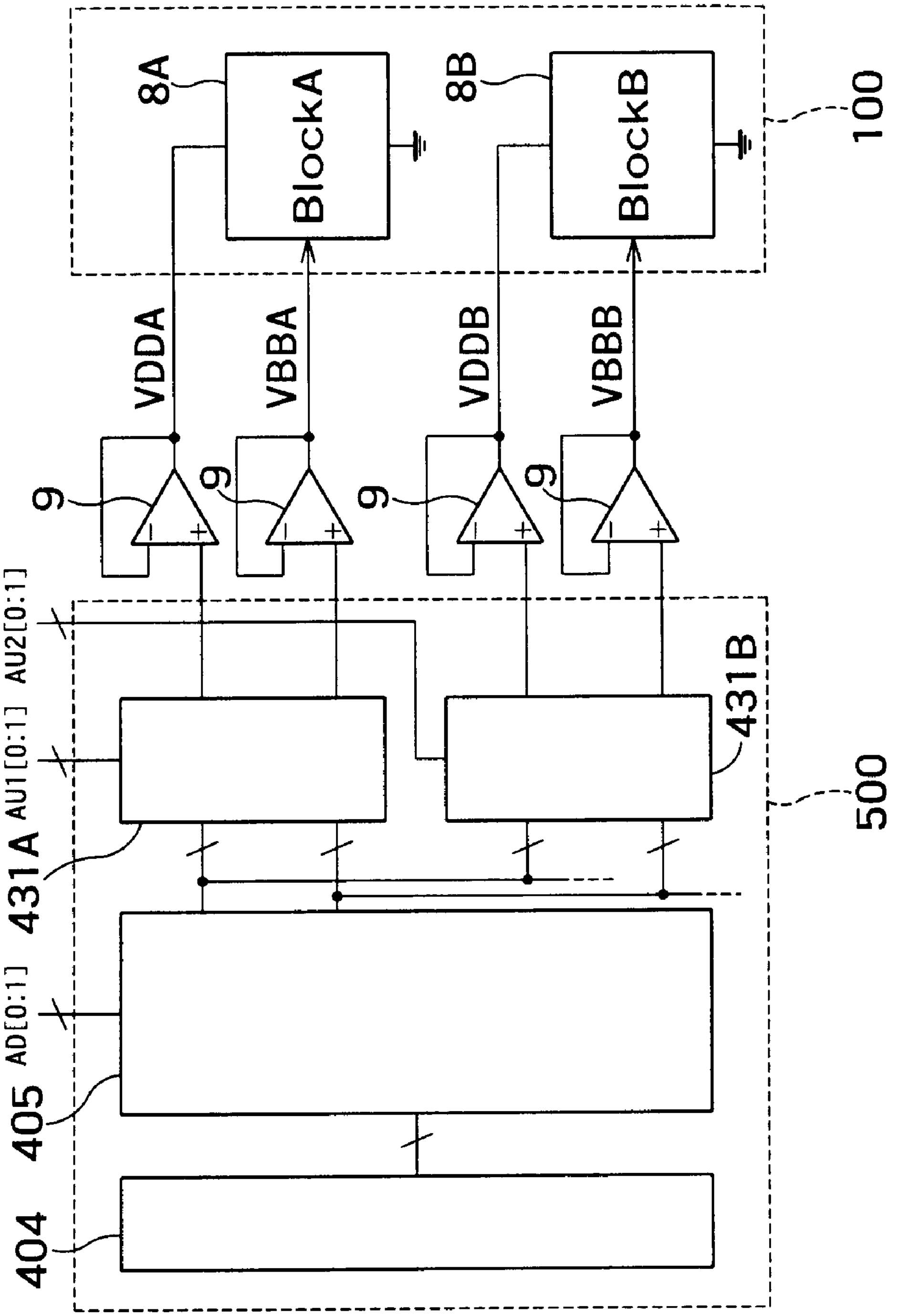
FIG. 9 is a block diagram showing LSI 100 having a plurality of blocks and a control circuit 500 connected thereto.

FIG. 9 is a block diagram showing LSI 100 having a plurality of blocks and a control circuit 500 connected thereto. The blocks 8A and 8B need independent source voltages. The control circuit 500 includes source voltage selecting circuits 431A and 431B connected to the blocks 8A and 8B in the LSI 100, respectively. The ladder resistor 404 and the substrate bias selecting circuit 405 are commonly used for both the source voltage selecting circuits 431A and 431B.

Since the LSI 100 is a single chip, blocks 8A and 8B involve similar process-derived variance in threshold values of transistors. Therefore, the respective blocks 8A and 8B need source voltages VDD independent from each other, and need substrate biases VBB with a substantially constant difference from the associated source voltages.

The source voltage selecting circuit 431A applies a source voltage VDDA and a substrate bias VBBA pursuant to control signals AU1 and AD. The source voltage selecting circuit 431B applies a source voltage VDDB and a substrate bias VBBB pursuant to control signals AU2 and AD. The source voltages VDDA, VDDB and the substrate bias voltages VBBA, VBBB are buffered by the buffer circuit 9 respectively, and supplied to the block 8A or 8B.

The instant embodiment can supply desired potential voltages for individual blocks in the LSI. Furthermore, this invention can supply individual blocks with substrate biases having a substantially constant potential difference from the source voltages to be supplied to individual blocks. As such, this embodiment can control properties of transistors in the entire LSI chip and individual circuit capabilities of individual blocks independently.

Figure 10:
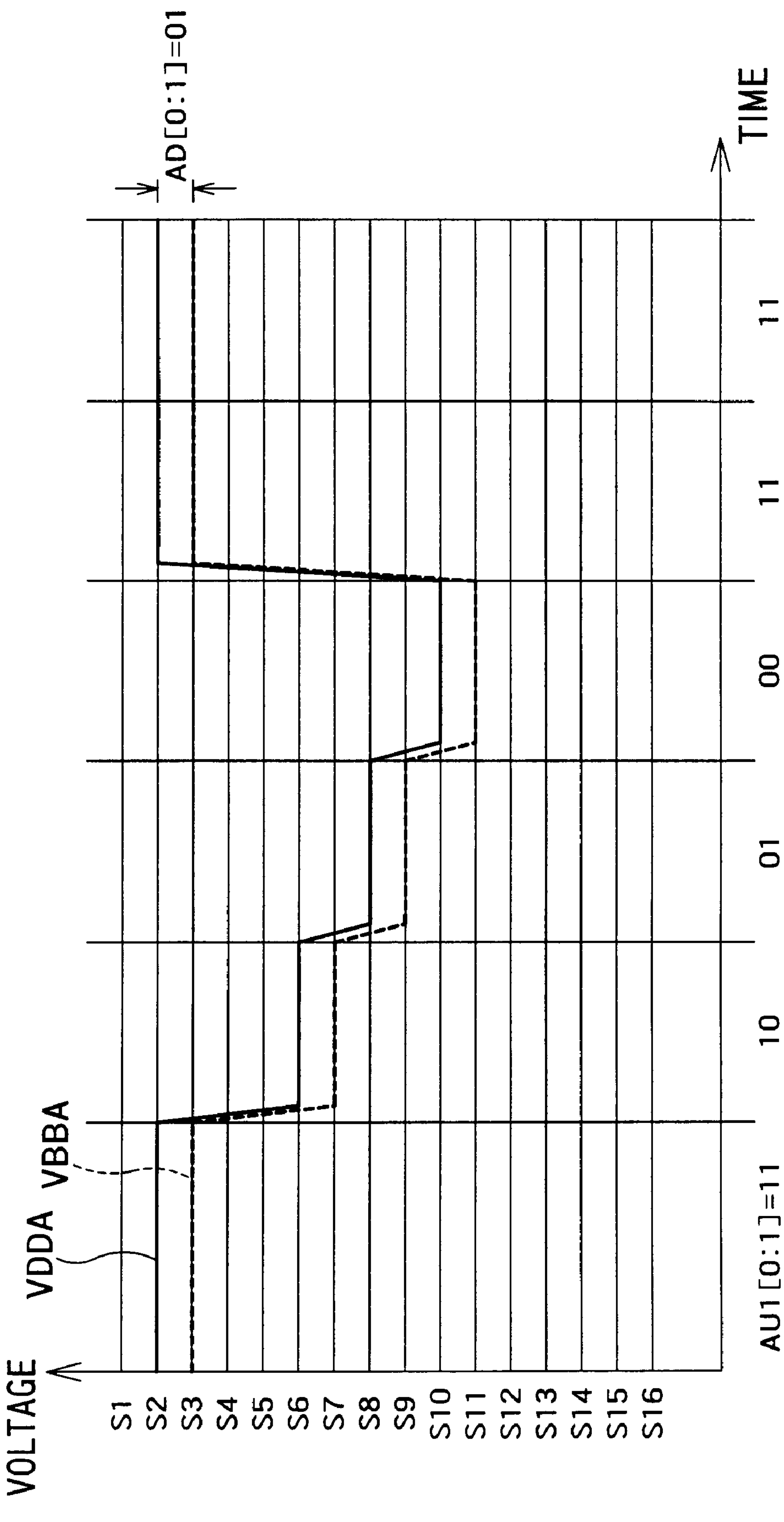
FIG. 10 is a graph showing voltage levels of the source voltage VDDA and the substrate bias VBBA shown in FIG. 9.
Figure 11:
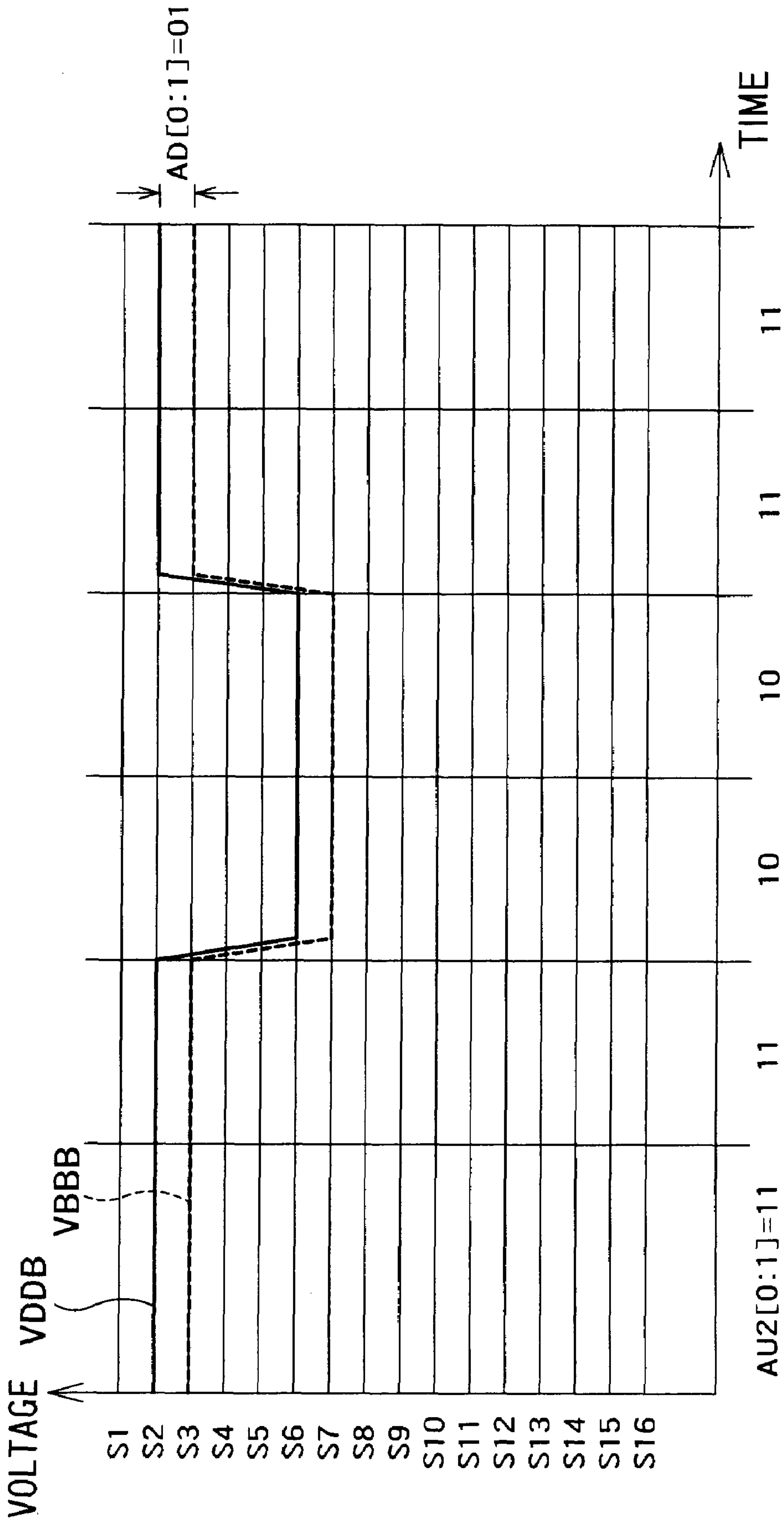
FIG. 11 is a graph showing voltage levels of the source voltage VDDB and the substrate bias VBBB shown in FIG. 9.
Figure 12:
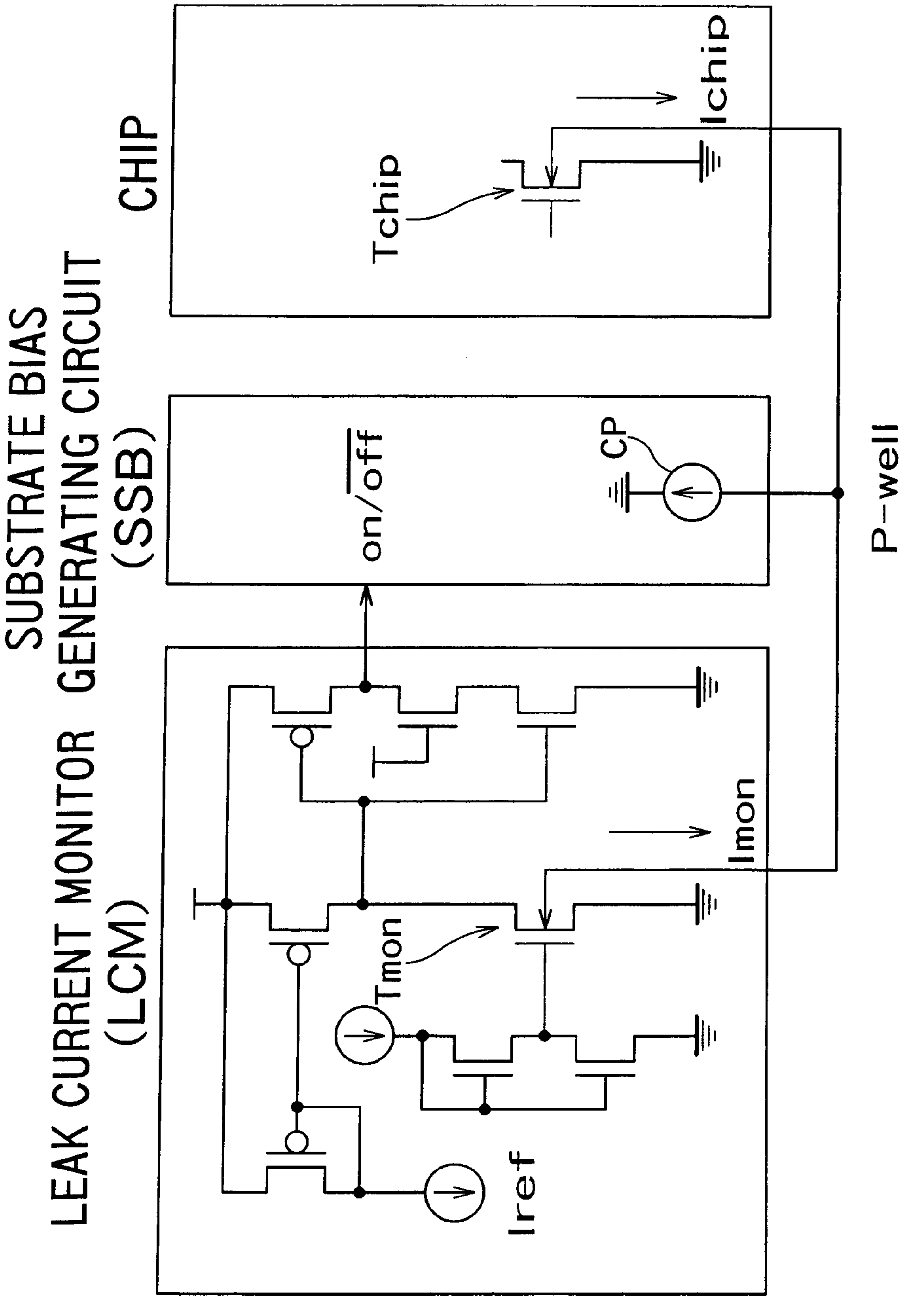
PRIOR ART FIG. 12
FIG. 12 is a diagram related to Non-patent Document 1.

FIG. 10 is a graph showing voltage levels of the source voltage VDDA and the substrate bias VBBA shown in FIG. 9. FIG. 11 is a graph showing voltage levels of the source voltage VDDB and the substrate bias VBBB shown in FIG. 9. In each of these graphs, the ordinate shows voltage levels of the source voltage and the substrate bias, and the abscissa shows time.

The control signal AU1, for example, changes with time in the order of [11], [10], [01], [00] and [11], and the control signal AU2 changes with time in the order of [11], [10] and [11].

In case the control signal AD is [01], the substrate biases VBBA and VBBB have voltage levels lower by one level than the source voltages VDDA and VDDB, respectively. As such, this embodiment can generate substrate biases always lower by one level than the source voltages.

FIG. 9 shows the LSI as having two blocks. However, it may include more blocks. In this case, the control circuit 500 includes source voltage selecting circuits 431 equal in number to the number of blocks. Accordingly, the number of control signals AU is equal to the number of blocks controlling the source voltage selecting circuits 431.

In the fourth and fifth embodiments, when a source voltage VDD changes with the change of the control signal AU, it may occur that the voltage level of the substrate bias VBB and the voltage level of the source voltage VDD exhibit transitional reversal. In this case, it may occur that a forward bias as large as exceeding the built-in potential is applied to the PN-junction between the source of a transistor in the LSI 100 and a channel region of the transistor. This problem, however, can be overcome by temporarily short-circuiting the source voltage VDD and the substrate bias VBB when the source voltage VDD changes. Alternatively, the source voltage VDD and the substrate bias VBB may be changed at different timings.

What is claimed is:

1. A semiconductor integrated circuit comprising:

a semiconductor substrate;

a plurality of well regions formed on one surface of the semiconductor substrate and electrically isolated from each other;

a plurality of MOS transistors formed in each well region; and a plurality of substrate bias generators each of which corresponds to one of the plurality of well regions, substrate biases being applied by the substrate bias generators being no less than a first power supply voltage and no more than a second power supply voltage, wherein each substrate bias generator comprises:

a controller including a storage portion storing a corresponding one of values of the substrate biases;

a DA converter outputting an analogue signal that depends on the corresponding one of the values of the substrate biases transmitted from the controller; and an operation amplifier amplifying a potential difference between the analogue signal and a corresponding predetermined reference voltage to output a corresponding one of the substrate biases.

2. The semiconductor integrated circuit according to claim 1, wherein the operation amplifier of each substrate bias generator applies the corresponding substrate bias under low output impedance.

3. The semiconductor integrated circuit according to claim 1, wherein the predetermined reference voltage of each substrate bias generator corresponding to an N-type well region is the second power supply voltage, and the substrate bias of each substrate bias generator corresponding to the N-type well region is applied to the N-type well region.

4. The semiconductor integrated circuit according to claim 1, wherein the predetermined reference voltage of each substrate bias generator corresponding to a P-type well region is different from the second power supply voltage, and the substrate bias of each substrate bias generator corresponding to the P-type well region is applied to the P-type well region.

5. The semiconductor integrated circuit according to claim 1, wherein each substrate bias generator further includes:

a corresponding variable resistor connected to the first power supply voltage or the second power supply voltage; and a corresponding resistor controller controlling the corresponding variable resistor.

6. The semiconductor integrated circuit according to claim 5, wherein the corresponding variable resistor is provided for each corresponding well region and is connected to sources of the MOS transistors in a corresponding well region.

7. The semiconductor integrated circuit according to claim 6, wherein one of the corresponding predetermined reference voltages has a value obtained by subtracting a first correction voltage from the second power supply voltage, the first correction voltage has a value corresponding to one half or more of the process-derived variance width of the threshold voltages of the MOS transistors, and the corresponding substrate bias is applied to N-type well regions.

8. The semiconductor integrated circuit according to claim 6, wherein the variable resistors provided for the well regions have a substantially same value.

9. The semiconductor integrated circuit according to claim 7, wherein another one of the corresponding predetermined reference voltages has a value obtained by adding a second correction voltage to the first power supply voltage, the second correction voltage has a value corresponding to one half or more of the process-derived variance width of the threshold voltages of the MOS transistors, and the corresponding substrate bias is applied to P-type well regions.

* * * * *